(12) United States Patent
Suekawa (10) Patent No.: US 7,250,639 B1
(45) Date of Patent: Jul. 31, 2007

(54) INSULATED GATE BIPOLAR TRANSISTOR

(75) Inventor: Eisuke Suekawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 21 days.

(21) Appl. No.: 10/109,838

(22) Filed: Apr. 1, 2002

(30) Foreign Application Priority Data

Jul. 17, 2001 (JP) .............................. 2001-216135

(51) Int. Cl.
*H01L 29/74* (2006.01)
*H01L 31/111* (2006.01)

(52) U.S. Cl. .............................. 257/133; 257/E29.027

(58) Field of Classification Search ................ 257/273, 257/331, E29.197, 262, 107, 119, 120, 132–133, 257/134–140, 143–146, 147–153, 167–172, 257/177–178, 378–379, 577, 584; 438/379
See application file for complete search history.

(56) References Cited

U.S. PATENT DOCUMENTS

| | | | |
|---|---|---|---|
| 4,980,743 A | * | 12/1990 | Nakagawa et al. ......... 257/143 |
| 5,289,019 A | | 2/1994 | Terashima |
| 5,372,954 A | | 12/1994 | Terashima |
| 5,589,408 A | * | 12/1996 | Robb et al. .................... 437/29 |
| 6,111,290 A | * | 8/2000 | Uenishi et al. ............. 257/331 |

FOREIGN PATENT DOCUMENTS

| | | |
|---|---|---|
| DE | 41 12 905 A1 | 10/1991 |
| DE | 197 31 495 A1 | 1/1999 |
| JP | 64-80077 | 3/1989 |
| JP | 3-184565 | 8/1991 |
| JP | 5-90593 | 4/1993 |
| JP | 05152574 A * | 6/1993 |
| JP | 6-69509 | 3/1994 |

* cited by examiner

*Primary Examiner*—B. William Baumeister
*Assistant Examiner*—Dana Farahani
(74) *Attorney, Agent, or Firm*—Oblon, Spivak, McClelland, Maier & Neustadt, P.C.

(57) ABSTRACT

An IGBT includes a plurality of $n^+$ doped regions (11) selectively formed in a main surface (103) of a $p^+$ semiconductor layer (12) opposite from an n type semiconductor layer (80) without being connected to the n type semiconductor layer (80). The $n^+$ doped regions (11) are formed in corresponding relation to and only under channel regions (CH1a-CH1d) of structures (200a-200d), respectively. This lowers the effective concentration of the $p^+$ semiconductor layer (12) on the $n^+$ doped regions (11) to reduce the number of holes injected from a collector layer (9) in an off state, reducing a leakage current.

8 Claims, 6 Drawing Sheets

INSULATED GATE BIPOLAR TRANSISTOR

BACKGROUND OF THE INVENTION

1. Field of the Invention

The present invention relates to an insulated gate bipolar transistor (referred to hereinafter as an "IGBT") for use in an inverter and the like.

2. Description of the Background Art

Figure 7:
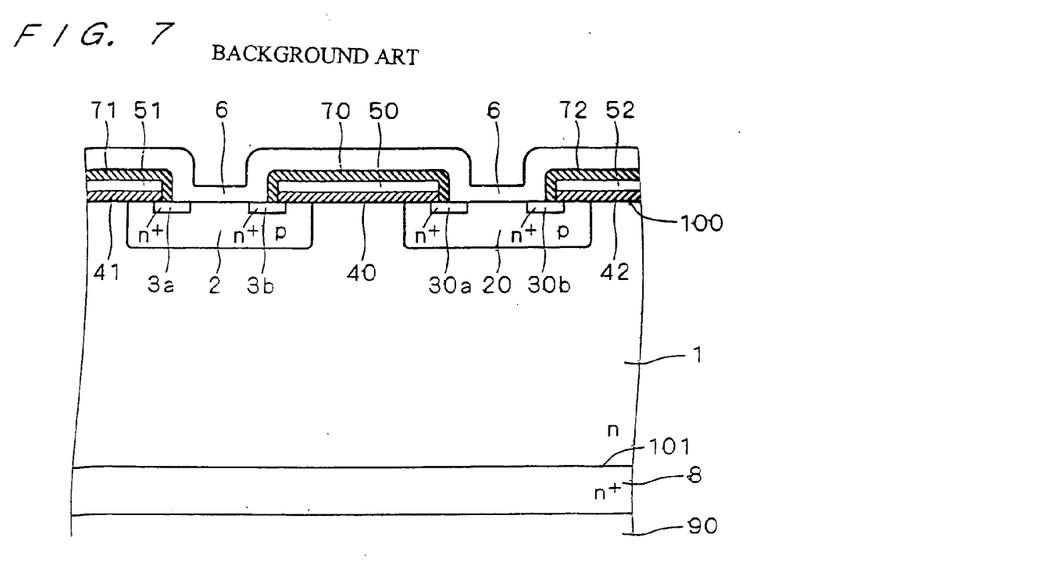
FIG. 7 is a schematic sectional view showing a structure of a first background art IGBT.

FIG. 7 is a schematic sectional view showing a structure of a first background art IGBT. As shown in FIG. 7, p doped regions 2 and 20 spaced a predetermined distance apart from each other are selectively formed in one main surface 100 of an n semiconductor layer 1 serving as an n type semiconductor substrate. $N^+$ doped regions 3a and 3b spaced a predetermined distance apart from each other are selectively formed in a surface of the p doped region 2. Similarly, $n^+$ doped regions 30a and 30b spaced a predetermined distance apart from each other are selectively formed in a surface of the p doped region 20.

An insulation film 40 is formed on part of the main surface 100 of the n semiconductor layer 1 which lies between the $n^+$ doped regions 3b and 30a, and a gate electrode 50 is formed on the insulation film 40. An interlayer insulation film 70 is formed to cover the gate electrode 50. Similarly, an insulation film 41 is formed on part of the main surface 100 of the n semiconductor layer 1 which lies between the $n^+$ doped region 3a and an $n^+$ doped region not shown in FIG. 7, and a gate electrode 51 is formed on the insulation film 41. An interlayer insulation film 71 is formed to cover the gate electrode 51. An insulation film 42 is formed on part of the main surface 100 of the n semiconductor layer 1 which lies between the $n^+$ doped region 30b and an $n^+$ doped region not shown in FIG. 7, and a gate electrode 52 is formed on the insulation film 42. An interlayer insulation film 72 is formed to cover the gate electrode 52.

An emitter electrode 6 is formed on the main surface 100 of the n semiconductor layer 1 and on the interlayer insulation films 70 to 72. The emitter electrode 6 is connected to the $n^+$ doped regions 3a, 3b, 30a, 30b and the p doped regions 2, 20.

An $n^+$ buffer layer 8 having an impurity concentration higher than that of the n semiconductor layer 1 is formed on a main surface 101 of the n semiconductor layer 1 opposite from the main surface 100. A collector layer 90 which is a $p^+$ semiconductor layer having a substantially uniform impurity concentration is formed on a main surface of the $n^+$ buffer layer 8 opposite from the n semiconductor layer 1. A collector electrode 10 is formed on a main surface of the collector layer 90 opposite from the $n^+$ buffer layer 8.

The first background art IGBT having the above-mentioned structure is disadvantageous in that a large number of holes injected from the collector layer 90 which is the $p^+$ semiconductor layer in an off state make an off-state leakage current (referred to simply as a "leakage current" hereinafter) high at elevated temperatures. In general, the reduction in thickness of the n semiconductor layer 1 is very effective to improve characteristics, such as an on-state voltage and a turn-off power dissipation, of a high-breakdown-voltage IGBT. However, in reaction to the reduction in thickness of the n semiconductor layer 1, the current gain hFE of an internal pnp transistor increases in the off state to increase the leakage current. In particular, the first background art IGBT in which a large number of holes are injected from the collector layer 90 in the off state as discussed above presents a problem such that the reduction in thickness of the n semiconductor layer 1 significantly increases the leakage current. The "internal pnp transistor" in the first background art IGBT means a pnp bipolar transistor comprising the n semiconductor layer 1 and the $n^+$ buffer layer 8 regarded as a base region, the p doped region 2 or the p doped region 20 regarded as a collector region, and the collector layer 90 regarded as an emitter region. The "off state" is a state in which, for example, the emitter electrode 6 and the gate electrodes 50 to 52 are placed at the same potential whereas a higher potential is applied to the collector electrode 10 than to the emitter electrode 6 and the gate electrodes 50 to 52, and in which the IGBT is off. The "leakage current" means a current flowing between the collector electrode 10 and the emitter electrode 6 in the off state.

Figure 8:
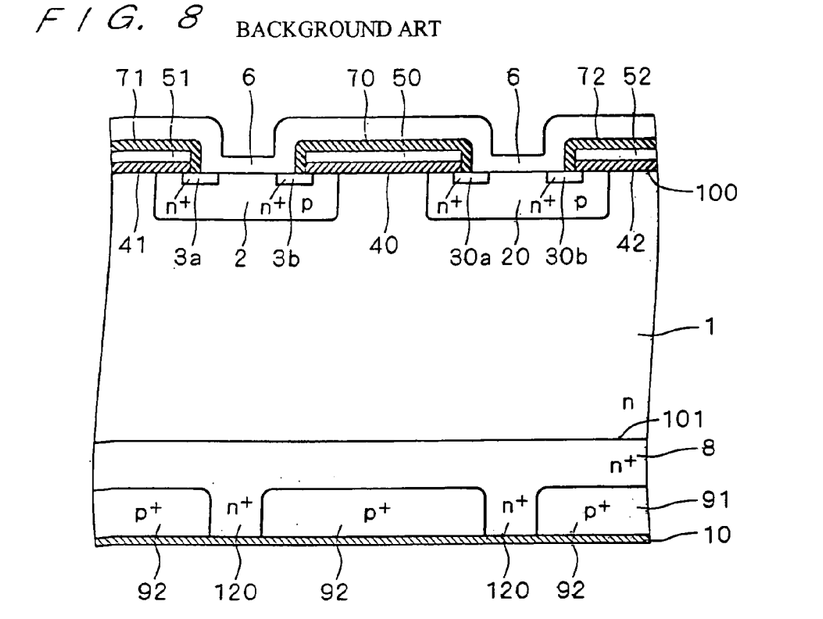
FIG. 8 is a schematic sectional view showing a structure of a second background art IGBT.

To solve the above-mentioned problem, there has been proposed a second background art IGBT. FIG. 8 is a schematic sectional view showing a structure of the second background art IGBT. Although the collector layer 90 in the first background art IGBT is the $p^+$ semiconductor layer having a substantially uniform impurity concentration, the second background art IGBT comprises a collector layer 91 in which collector short regions 120 which are $n^+$ doped regions and $p^+$ doped regions 92 alternate with each other.

More specifically, as shown in FIG. 8, the collector layer 91 has the collector short regions 120 and the $p^+$ doped regions 92 which are formed alternately on the main surface of the $n^+$ buffer layer 8 opposite from the n semiconductor layer 1. The collector electrode 10 is formed on a main surface of the collector layer 91 opposite from the $n^+$ buffer layer 8. In other words, the collector electrode 10 is formed to cover the collector short regions 120 and the $p^+$ doped regions 92. Such a structure is referred to as a "collector short structure."

In the second background art IGBT having the above-mentioned structure, most electron currents leaked from the emitter electrode 6 side flow through the collector short regions 120 into the collector electrode 10 in the off state. This reduces the number of holes injected from the $p^+$ doped regions 92. Therefore, the second background art IGBT can reduce the leakage current below that of the first background art IGBT, and alleviate the increase in leakage current resulting from the reduction in thickness of the n semiconductor layer 1.

There has been proposed a third background art IGBT different in structure from the second background art IGBT for reducing the leakage current below that of the first background art IGBT.

Figure 9:
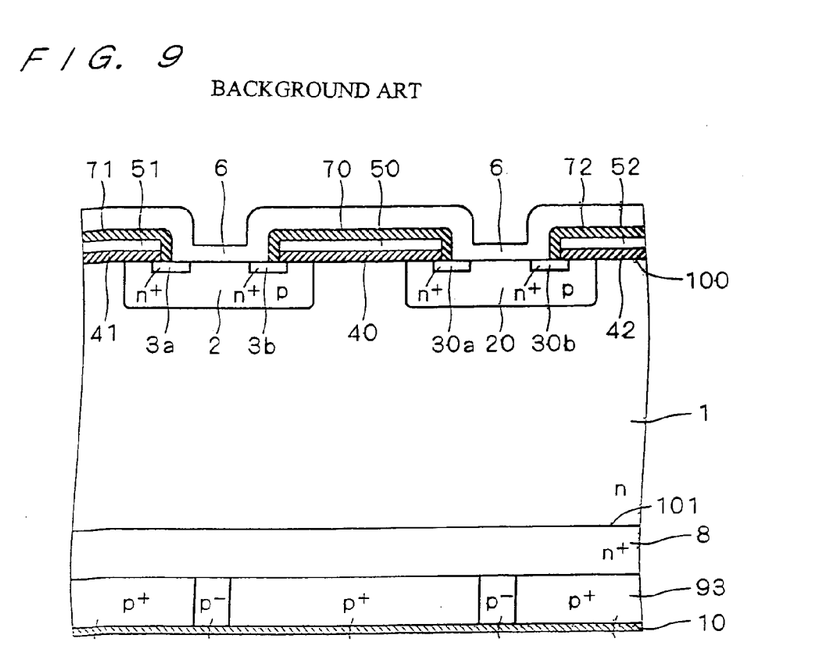
FIG. 9 is a schematic sectional view showing a structure of a third background art IGBT.

FIG. 9 is a schematic sectional view showing a structure of the third background art IGBT. Although the collector layer 90 in the first background art IGBT is the $p^+$ semiconductor layer having a substantially uniform impurity concentration, the third background art IGBT comprises a collector layer 93 in which $p^+$ doped regions 94 and $p^-$ doped regions 95 having an impurity concentration lower than that of the $p^+$ doped regions 94 alternate with each other.

More specifically, as shown in FIG. 9, the collector layer 93 has the $p^+$ doped regions 94 and the $p^-$ doped regions 95 which are formed alternately on the main surface of the $n^+$ buffer layer 8 opposite from the n semiconductor layer 1. The collector electrode 10 is formed on a main surface of the collector layer 93 opposite from the $n^+$ buffer layer 8. In other words, the collector electrode 10 is formed to cover the $p^+$ doped regions 94 and the $p^-$ doped regions 95.

In the third background art IGBT having the above-mentioned structure, the total amount of impurity in the collector layer 93 is less than that in the collector layer 90 of the first background art IGBT. In the off state, the electron currents leaked from the emitter electrode 6 side are more easily flow through the p⁻ doped regions 95 having a lower impurity concentration into the collector electrode 10. This reduces the number of holes injected from the collector layer 93. Therefore, the third background art IGBT can reduce the leakage current below that of the first background art IGBT, and alleviate the increase in leakage current resulting from the reduction in thickness of the n semiconductor layer 1, as compared with the first background art IGBT.

Unfortunately, the second background art IGBT configured to have the collector short structure includes a parasitic diode comprised of, for example, the p doped region 2, the n semiconductor layer 1, the n⁺ buffer layer 8 and the collector short regions 120. When used in an inverter and the like, the second background art IGBT is broken down in a freewheeling mode.

In the third background art IGBT, the electron currents flowing from the emitter electrode 6 side at turn-off flow rapidly through the p⁻ doped regions 95 having a lower impurity concentration into the collector electrode 10. This rapidly decays the tail current in the collector current of the IGBT to reduce the turn-off power dissipation, but a collector-emitter voltage oscillates in some cases in timed relationship with the abrupt decay of the tail current. Thus, the third background art IGBT might malfunction or be broken down in the worst case.

Figure 10:
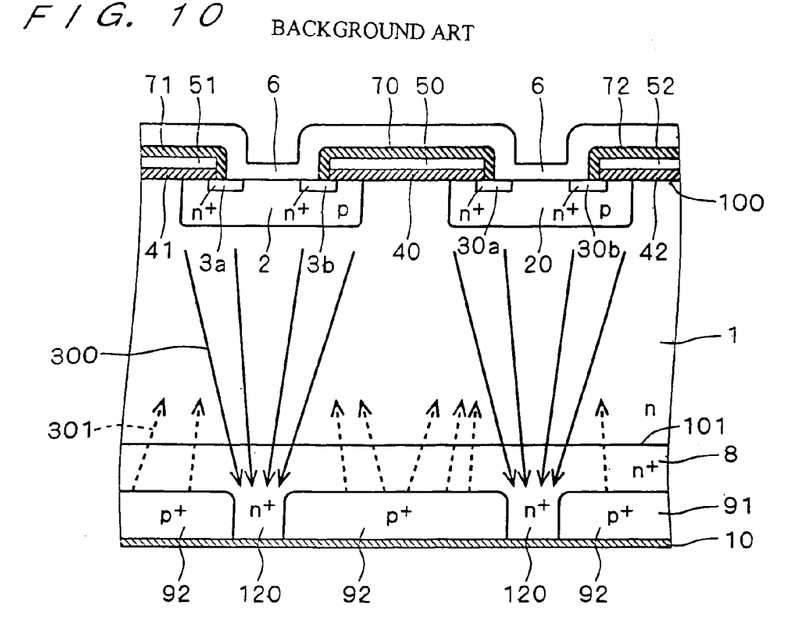
FIG. 10 shows electron currents flowing in the second background art IGBT.

There has been another problem such that the electron currents flowing from the emitter electrode 6 side while the IGBT is on are crowded in the IGBT to degrade the characteristics of the IGBT, depending on the position and number of regions easily conducting the electron currents in the collector layer, e.g. the collector short regions 120 in the second background art IGBT and the p⁻ doped regions 95 in the third background art IGBT. FIG. 10 shows electron currents flowing in the second background art IGBT, and FIG. 11 shows electron currents flowing in the third background art IGBT.

As illustrated in FIG. 10, electron currents 300 from the emitter electrode 6 side while the IGBT is on flow toward the collector layer 91. Since the collector layer 91 has the collector short regions 120 which are the n⁺ doped regions, most of the electron currents 300 flow into the collector short regions 120. This gives rise to the crowding of the electron currents 300 in the second background art IGBT, depending on the position and number of collector short regions 120, as shown in FIG. 10. Hole currents 301 flowing in the IGBT are also shown in FIG. 10.

Figure 11:
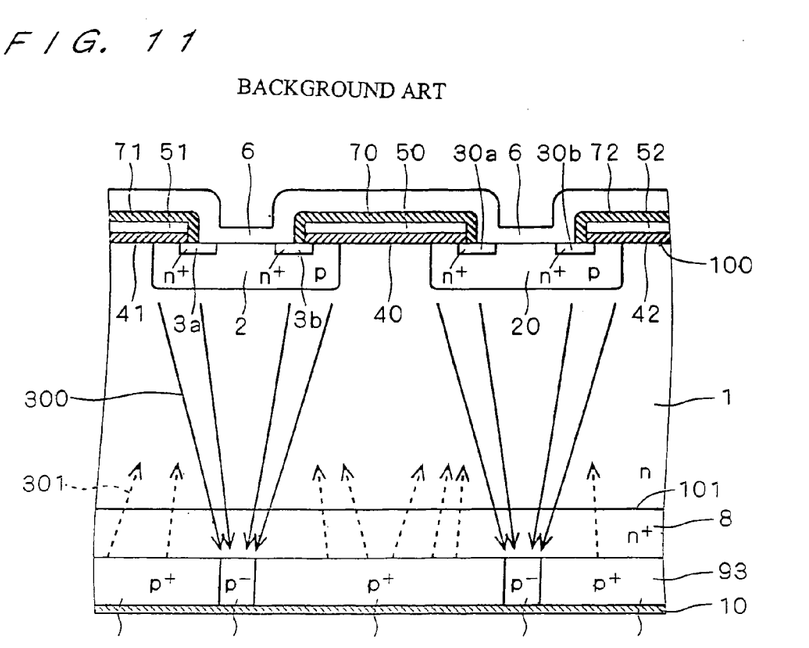
FIG. 11 shows electron currents flowing in the third background art IGBT.

As illustrated in FIG. 11, the electron currents 300 from the emitter electrode 6 side while the IGBT is on flow toward the collector layer 93. Since the collector layer 93 has the partially formed p⁻ doped regions 95 having a lower impurity concentration, most of the electron currents 300 flow into the p⁻ doped regions 95. This gives rise to the crowding of the electron currents 300 in the third background art IGBT, depending on the position and number of p⁻ doped regions 95, as shown in FIG. 11.

SUMMARY OF THE INVENTION

According to a first aspect of the present invention, an insulated gate bipolar transistor comprises: a first semiconductor layer of a first conductivity type having a first main surface and a second main surface opposite from the first main surface; a second semiconductor layer of a second conductivity type formed on the first main surface of the first semiconductor layer; a plurality of first doped regions of the first conductivity type selectively formed in a main surface of the second semiconductor layer opposite from the first semiconductor layer without being connected to the first semiconductor layer; a collector electrode formed on the main surface of the second semiconductor layer to cover a surface of each of the first doped regions; and a plurality of structures each including a second doped region of the second conductivity type selectively formed in the second main surface of the first semiconductor layer without being connected to the second semiconductor layer, a third doped region of the first conductivity type selectively formed in a surface of the second doped region without being connected to the first semiconductor layer, a channel region defined in a portion of the surface of the second doped region which lies between the third doped region and the first semiconductor layer, an insulation film formed on the channel region, a gate electrode formed on the insulation film, and an emitter electrode connected to the second and third doped regions, wherein the plurality of first doped regions are formed in corresponding relation to and only under the channel regions of the structures, respectively.

Preferably, in the insulated gate bipolar transistor of the first aspect, the first semiconductor layer comprises a buffer layer having the first main surface, and a third semiconductor layer having the second main surface; and the buffer layer is formed on a main surface of the third semiconductor layer opposite from the second main surface, and has an impurity concentration higher than that of the third semiconductor layer.

Preferably, in the insulated gate bipolar transistor of the first aspect, the second semiconductor layer has a substantially uniform impurity concentration.

According to a second aspect of the present invention, the insulated gate bipolar transistor of the first aspect further comprises a polysilicon layer in contact with the surface of each of the first doped regions and the main surface of the second semiconductor layer, wherein the collector electrode is formed over the main surface of the second semiconductor layer to cover the surface of each of the first doped regions, with the polysilicon layer lying between the collector electrode, and the first doped regions and the second semiconductor layer.

Preferably, in the insulated gate bipolar transistor of the second aspect, the first semiconductor layer comprises a buffer layer having the first main surface, and a third semiconductor layer having the second main surface; and the buffer layer is formed on a main surface of the third semiconductor layer opposite from the second main surface, and has an impurity concentration higher than that of the third semiconductor layer.

Preferably, in the insulated gate bipolar transistor of the second aspect, the second semiconductor layer has a substantially uniform impurity concentration.

In the insulated gate bipolar transistor of the first aspect of the present invention, the selective formation of the first doped regions in the third main surface of the second semiconductor layer without being connected to the first semiconductor layer makes the effective concentration of the second semiconductor layer on the first doped regions lower. If the first conductivity type is an n type and the second conductivity type is a p type, the number of holes injected from the second semiconductor layer is reduced when the emitter electrode and the gate electrode are placed at the same potential and a higher potential is applied to the collector electrode than to the emitter and gate electrodes (in the off state). Consequently, the leakage current is reduced.

The non-connection of the first doped regions to the first semiconductor layer prevents a parasitic diode from being formed when connection is established between the first doped regions and the first semiconductor layer. Therefore, the insulated gate bipolar transistor of the first aspect can perform a stable operation when used in an inverter and the like.

The second semiconductor layer does not include a partially formed lower impurity concentration region. In other words, the second semiconductor layer has a substantially uniform impurity concentration. If the first conductivity type is the n type and the second conductivity type is the p type, electron currents flowing from the emitter electrode side at turn-off flow into the collector electrode uniformly. This suppresses the abrupt decay of the tail current in the collector current resulting from the partial formation of the lower impurity concentration region at turn-off, to suppress the oscillation of the collector-emitter voltage. This provides the IGBT which performs a stable operation.

The first doped regions easily conducting electron currents are formed in corresponding relation to and only under the channel regions, respectively. If the first conductivity type is the n type and the second conductivity type is the p type, the electron currents flowing under the channel regions flow toward the corresponding first doped regions under the channel regions, respectively, when the insulated gate bipolar transistor of the first aspect is on. This reliably alleviates electron current crowding in the IGBT which has occurred depending on the position and number of regions easily conducting the electron currents, thereby to reliably reduce the degradation of the characteristics due to the current crowding.

In the insulated gate bipolar transistor of the second aspect of the present invention, the polysilicon layer is in contact with the surface of each of the first doped regions and the main surface of the second semiconductor layer. This produces a gettering effect at the contact surface between the polysilicon layer, and the first doped regions and second semiconductor layer, to alleviate lifetime shortening due to heavy metals introduced in a manufacturing process. Consequently, the IGBT of the second aspect can alleviate the increase in on-state voltage and in leakage current resulting from the lifetime shortening.

It is therefore an object of the present invention to provide an IGBT which reduces a leakage current, reliably alleviates electron current crowding in the IGBT, and performs a stable operation.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
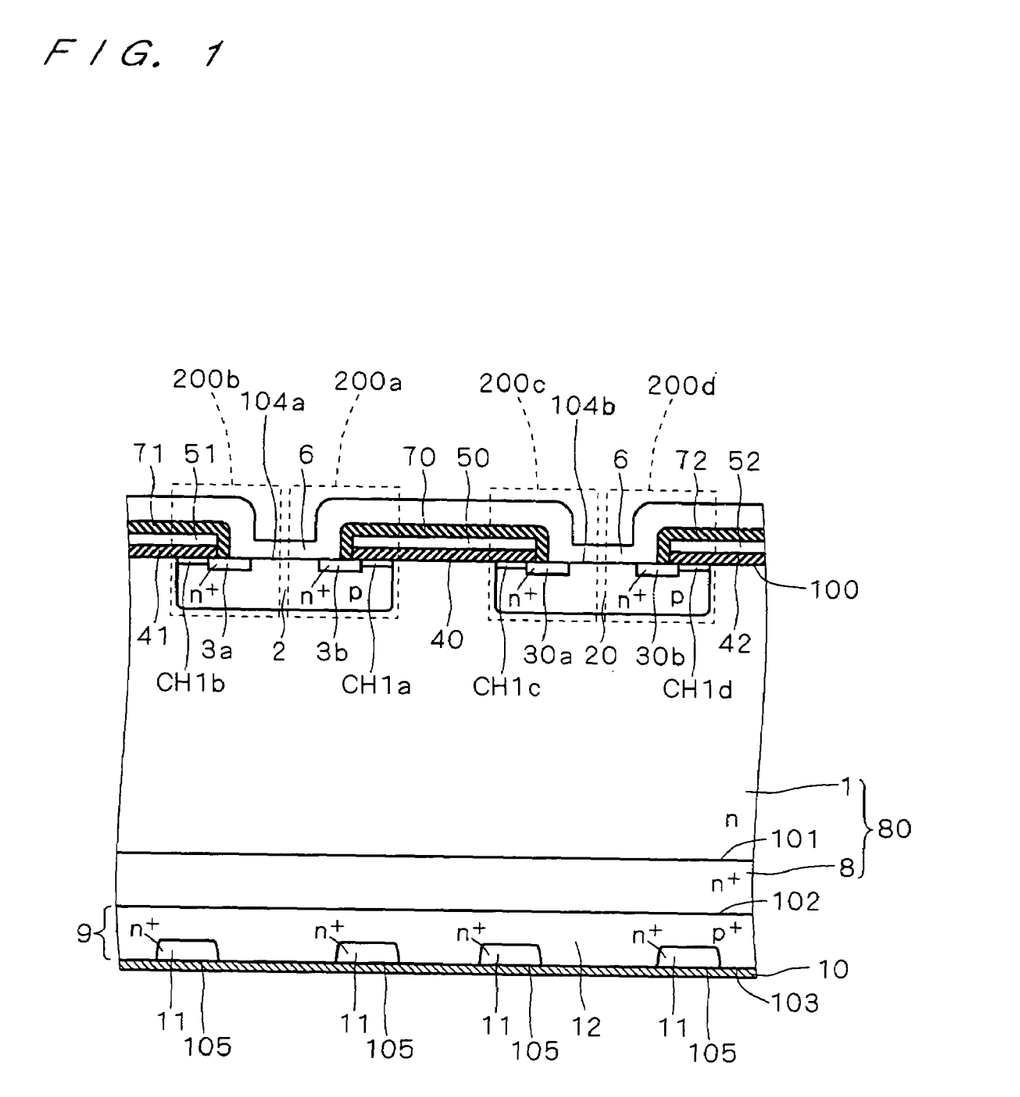
FIGS. 1 and 2 are schematic sectional views showing a structure of an IGBT according to a first preferred embodiment of the present invention.

FIG. 1 is a schematic sectional view showing a structure of an IGBT according to a first preferred embodiment of the present invention. As shown in FIG. 1, the IGBT according to the first preferred embodiment comprises an n semiconductor layer 1 serving as an n type semiconductor substrate. An $n^+$ buffer layer 8 having an impurity concentration higher than that of the n semiconductor layer 1 is formed on one main surface 101 of the n semiconductor layer 1. A $p^+$ semiconductor layer 12 having a substantially uniform impurity concentration is formed on a main surface 102 of the $n^+$ buffer layer 8 opposite from the n semiconductor layer 1. The $p^+$ semiconductor layer 12 is formed, for example, by epitaxial growth to have a thickness of about 6-10 μm and an impurity concentration of about 1E18 $cm^{-3}$. In general, the provision of the $n^+$ buffer layer 8 on the n semiconductor layer 1 achieves the reduction in thickness of the n semiconductor layer 1 to consequently reduce the on-state voltage of the IGBT. Although the $n^+$ buffer layer 8 is provided on the n semiconductor layer 1 in the first preferred embodiment, whether or not to provide the $n^+$ buffer layer 8 is not a feature of the present invention, and thus the n semiconductor layer 1 and the $n^+$ buffer layer 8 are collectively referred to as an "n type semiconductor layer 80." Accordingly, a main surface 100 of the n semiconductor layer 1 is referred to as a "main surface 100 of the n type semiconductor layer 80," and the main surface 102 of the $n^+$ buffer layer 8 is referred to as a "main surface 102 of the n type semiconductor layer 80." Another expression of the foregoing using the n type semiconductor layer 80 is that the $p^+$ semiconductor layer 12 is formed on the main surface 102 of the n type semiconductor layer 80.

A plurality of $n^+$ doped regions 11 are selectively formed in a main surface 103 of the $p^+$ semiconductor layer 12 opposite from the n type semiconductor layer 80 without being connected to the n type semiconductor layer 80. The $n^+$ doped regions 11 are formed by implanting and diffusing an n type impurity from the main surface 103 side of the $p^+$ semiconductor layer 12. The $n^+$ doped regions 11 have a diffusion depth of, e.g., about 3-5 μm, and an impurity concentration of, e.g., about 2E18 $cm^{-3}$.

A collector electrode 10 is formed on the main surface 103 of the $p^+$ semiconductor layer 12 to cover a surface 105 of each of the $n^+$ doped regions 11. The $p^+$ semiconductor layer 12 and the $n^+$ doped regions 11 are collectively referred to as a "collector layer 9."

P doped regions 2 and 20 are selectively formed in the main surface 100 of the n type semiconductor layer 80 opposite from the main surface 102 without being connected to the $p^+$ semiconductor layer 12. The p doped regions 2 and 20 are spaced a predetermined distance apart from each other. $N^+$ doped regions 3a and 3b are selectively formed in a surface 104a of the p doped region 2 without being connected to the n type semiconductor layer 80. The n+ doped regions 3a and 3b are spaced a predetermined distance apart from each other. Similarly, n+ doped regions 30a and 30b are selectively formed in a surface 104b of the p doped region 20 without being connected to the n type semiconductor layer 80. The n+ doped regions 30a and 30b are spaced a predetermined distance apart from each other.

A channel region CH1a is defined in part of the surface 104a of the p doped region 2 which lies between the n+ doped region 3b and the n type semiconductor layer 80. A channel region CH1c is defined in part of the surface 104b of the p doped region 20 which lies between the n+ doped region 30a and the n type semiconductor layer 80. An insulation film 40 of, e.g., silicon oxide is formed on the channel regions CH1a and CH1c, and a gate electrode 50 of, e.g., polysilicon is formed on the insulation film 40. An interlayer insulation film 70 is formed to cover the gate electrode 50.

A channel region CH1b is defined in part of the surface 104a of the p doped region 2 which lies between the n+ doped region 3a and the n type semiconductor layer 80. An insulation film 41 of, e.g., silicon oxide is formed on the channel region CH1b, and a gate electrode 51 of, e.g., polysilicon is formed on the insulation film 41. An interlayer insulation film 71 is formed to cover the gate electrode 51. A channel region CH1d is defined in part of the surface 104b of the p doped region 20 which lies between the n+ doped region 30b and the n type semiconductor layer 80. An insulation film 42 of, e.g., silicon oxide is formed on the channel region CH1d, and a gate electrode 52 of, e.g., polysilicon is formed on the insulation film 42. An interlayer insulation film 72 is formed to cover the gate electrode 52.

The n+ doped regions 3a, 3b, 30a, 30b are collectively referred to also as an "n+ doped region 310." The p doped regions 2 and 20 are collectively referred to also as a "p doped region 210." The insulation films 40, 41, 42 are collectively referred to also as an "insulation film 400." The gate electrodes 50, 51, 52 are collectively referred to also as a "gate electrode 500." The interlayer insulation films 70, 71, 72 are collectively referred to also as an "interlayer insulation film 700." The channel regions CH1a to CH1d are collectively referred to also as a "channel region CH1." The above-mentioned channel region CH1 is a region in which an inversion layer is formed when a predetermined voltage is applied to the gate electrode 500.

An emitter electrode 6 is formed on the main surface 100 of the n type semiconductor layer 80 and on the interlayer insulation film 700. The emitter electrode 6 is connected to the n+ doped region 310 and the p doped region 210.

In the IGBT shown in FIG. 1 according to the first preferred embodiment, the p doped region 2, the n+ doped region 3b, the channel region CH1a, the insulation film 40, the gate electrode 50, and the emitter electrode 6 are collectively referred to as a structure 200a. In other words, the structure 200a comprises: the p doped region 2 selectively formed in the main surface 100 of the n type semiconductor layer 80 without being connected to the p+ semiconductor layer 12; the n+ doped region 3b selectively formed in the surface 104a of the p doped region 2 without being connected to the n type semiconductor layer 80; the channel region CH1a defined in the part of the surface 104a of the p doped region 2 which lies between the n+ doped region 3b and the n type semiconductor layer 80; the insulation film 40 formed on the channel region CH1a; the gate electrode 50 formed on the insulation film 40; and the emitter electrode 6 connected to the p doped region 2 and the n+ doped region 3b.

The p doped region 2, the n+ doped region 3a, the channel region CH1b, the insulation film 41, the gate electrode 51, and the emitter electrode 6 are collectively referred to as a structure 200b. The p doped region 20, the n+ doped region 30a, the channel region CH1c, the insulation film 40, the gate electrode 50, and the emitter electrode 6 are collectively referred to as a structure 200c. The p doped region 20, the n+ doped region 30b, the channel region CH1d, the insulation film 42, the gate electrode 52, and the emitter electrode 6 are collectively referred to as a structure 200d. That is, the IGBT according to the first preferred embodiment comprises the structures 200a to 200d. The structures 200a to 200d are collectively referred to also as a "structure 200." It is needless to say that the provision of the n type semiconductor layer 80, the collector layer 9, the collector electrode 10 and any one of the structures 200a to 200d, e.g. the structure 200a, enables the IGBT to operate as such.

Figure 2:
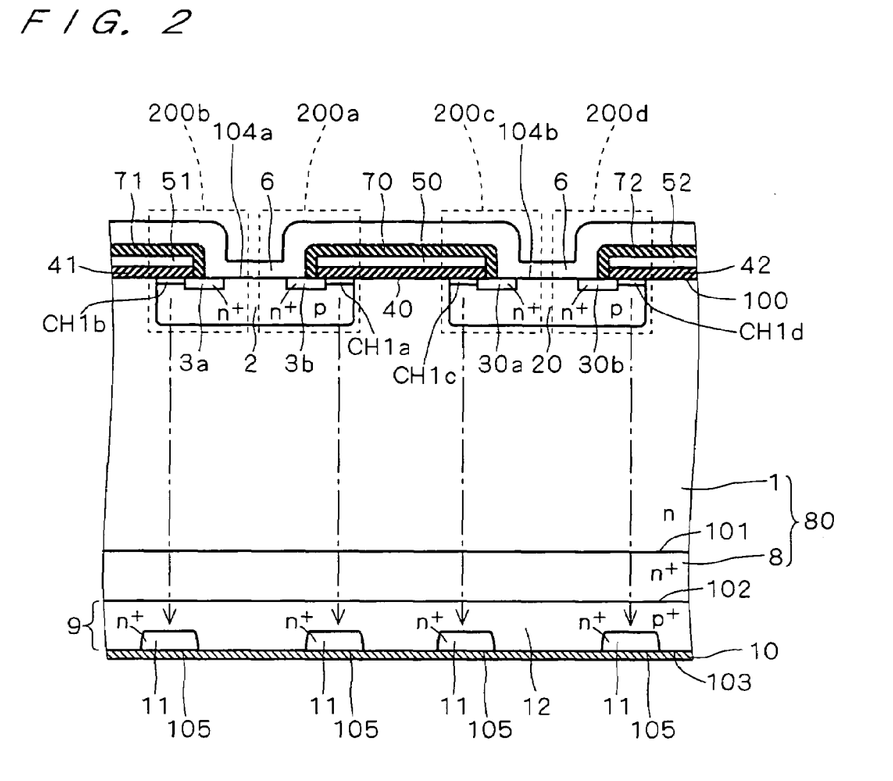

Next, the n+ doped regions 11 will be described in detail. FIG. 2 is a schematic sectional view showing the structure of the IGBT according to the first preferred embodiment, and illustrates the positional relationship between the channel region CH1 of the structure 200 and the n+ doped regions 11.

As shown in FIG. 2, the n+ doped regions 11 in the collector layer 9 are formed in corresponding relation to and only under the channel regions CH1a to CH1d, respectively, of the structure 200. In other words, as viewed in a direction perpendicular to the main surface 100 from the main surface 100 side of the n type semiconductor layer 80, the n+ doped regions 11 corresponding to the channel regions CH1a to CH1d are positioned only to underlie the channel regions CH1a to CH1d, respectively. That is, each of the n+ doped regions 11 corresponding to one of the channel regions CH1a to CH1d is positioned only on a line drawn from the corresponding one of the channel regions CH1a to CH1d in the direction perpendicular to the main surface 100 of the n type semiconductor layer 80. The dot-dash arrows of FIG. 2 indicate that the n+ doped regions 11 are formed only under the channel regions CH1a to CH1d, respectively.

Brief description will be given on the operation of the IGBT according to the first preferred embodiment having the above-mentioned structure. The IGBT turns on when a higher potential is applied to the gate electrode 500 than to the emitter electrode 6, with the potential of the collector electrode 10 held higher than that of the emitter electrode 6. More specifically, an inversion layer is formed in the channel region CH1, and electrons are injected from the emitter electrode 6 through the inversion layer into the n type semiconductor layer 80. The injection of electrons into the n type semiconductor layer 80 causes holes to be injected from the collector layer 9 into the n type semiconductor layer 80. As a result, conductivity modulation occurs in the n type semiconductor layer 80 to significantly reduce the resistance of the n type semiconductor layer 80. Thus, current flows between the collector electrode 10 and the emitter electrode 6.

When the gate electrode 500 and the emitter electrode 6 are placed at the same potential, the IGBT turns off, and almost no current flows between the collector electrode 10 and the emitter electrode 6.

In the IGBT according to the first preferred embodiment having the above-mentioned structure, since the n+ doped regions 11 are selectively formed in the main surface 103 of the p+ semiconductor layer 12 without being connected to the n type semiconductor layer 80, the effective concentration of the $p^+$ semiconductor layer 12 on the $n^+$ doped regions 11 becomes lower. In other words, the formation of the $n^+$ doped regions 11 in the collector layer 9 makes the total amount of p type impurity of the collector layer 9 smaller than that of the collector layer 90 of the first background art IGBT. This reduces the number of holes injected from the collector layer 9 in the off state, consequently to reduce the leakage current below that of the first background art IGBT and to alleviate the increase in leakage current resulting from the reduction in thickness of the n semiconductor layer 1 as compared with the first background art IGBT.

Figure 3:
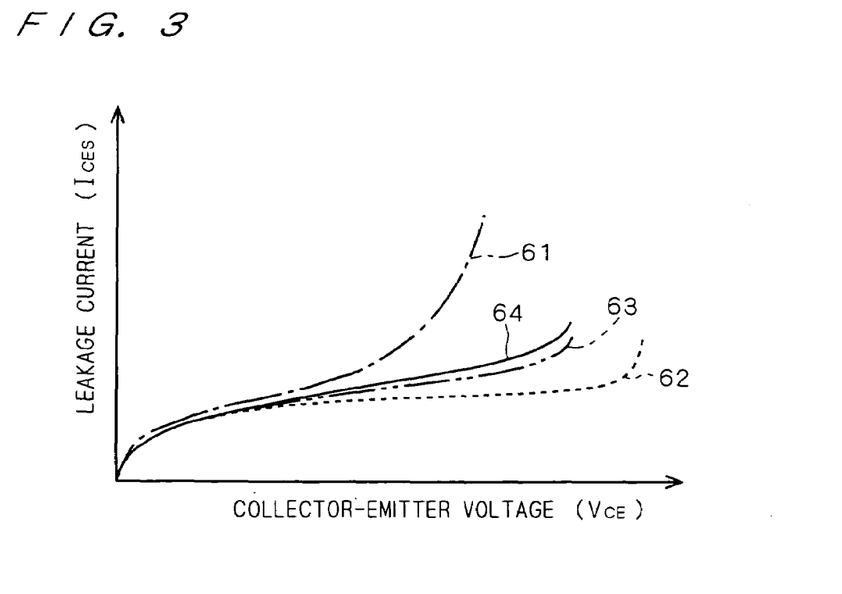
FIGS. 3 and 4 are graphs showing characteristics of the IGBT according to the first preferred embodiment of the present invention.

FIG. 3 is a graph showing a characteristic of the IGBT according to the first preferred embodiment of the present invention, and illustrates a relationship between a collector-emitter voltage $V_{CE}$ and a leakage current $I_{CES}$. In FIG. 3, the curve 61 indicates a characteristic of the first background art IGBT; the curve 62 indicates a characteristic of the second background art IGBT; the curve 63 indicates a characteristic of the third background art IGBT; and the curve 64 indicates the characteristic of the IGBT according to the first preferred embodiment. The characteristics of the first, second and third background art IGBTs indicated by the curves 61 to 63 shown in FIG. 3 are based on the following settings of the thickness and impurity concentration of the collector layers of the IGBTs. The collector layer 90 of the first background art IGBT is about 6-10 μm in thickness, and about 1E18 $cm^{-3}$ in impurity concentration. The collector layer 91 of the second background art IGBT is about 6-10 μm in thickness. The $p^+$ doped regions 92 of the collector layer 91 are about 1E18 $cm^{-3}$ in impurity concentration, and the collector short regions 120 thereof are about 1E17 $cm^{-3}$ in impurity concentration. The collector layer 93 of the third background art IGBT is about 6-10 μm in thickness. The $p^+$ doped regions 94 of the collector layer 93 are about 1 E18 $cm^{-3}$ in impurity concentration, and the $p^-$ doped regions 95 thereof are about 1E16-1E17 $cm^{-3}$ in impurity concentration. The IGBT according to the first preferred embodiment is similar in other structures than the collector layer to the first, second and third background art IGBTs.

It will be found from FIG. 3 that the leakage current of the IGBT according to the first preferred embodiment (indicated by the curve 64) is lower than the leakage current of the first background art IGBT (indicated by the curve 61).

In the IGBT according to the first preferred embodiment, because of the substantially uniform p type impurity concentration of the $p^+$ semiconductor layer 12, electron currents flowing from the emitter electrode 6 side at turn-off flow into the collector electrode 10 substantially uniformly. This suppresses the abrupt decay of the tail current in the collector current resulting from the presence of partially formed lower impurity concentration regions which has occurred in the third background art IGBT, to prevent the oscillation of the collector-emitter voltage. As a result, the IGBT which performs a stable operation is provided.

Figure 4:
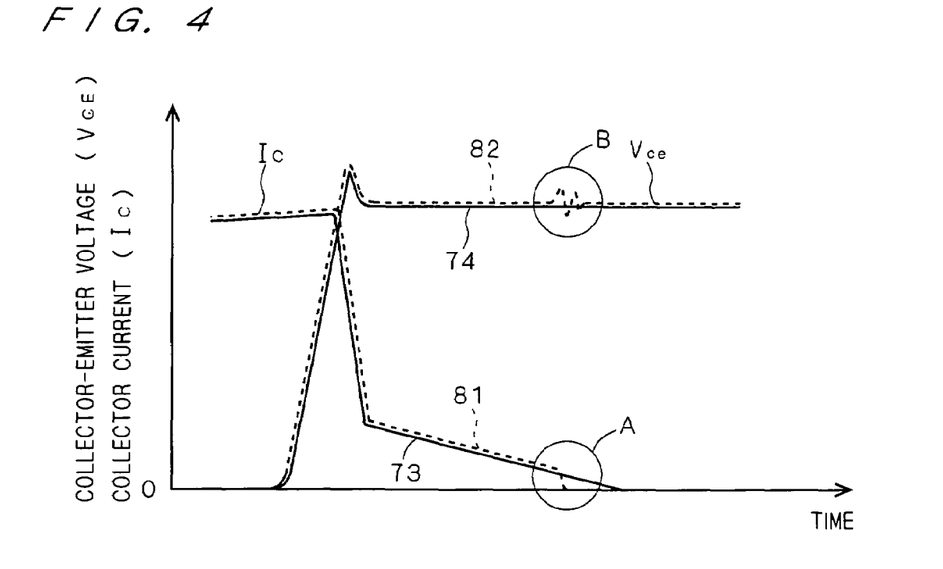

FIG. 4 is a graph showing characteristics of the IGBT according to the first preferred embodiment, and illustrates the characteristics of the collector-emitter voltage $V_{CE}$ and the collector current $I_C$ at turn-off. In FIG. 4, the curve 81 indicates the collector current of the first background art IGBT; the curve 73 indicates the collector current of the IGBT according to the first preferred embodiment; the curve 82 indicates the collector-emitter voltage of the third background art IGBT; and the curve 74 indicates the collector-emitter voltage of the IGBT according to the first preferred embodiment.

As indicated in a portion A of FIG. 4, the tail current in the collector current decays abruptly at turn-off in the third background art IGBT since the collector layer 93 partially has the lower impurity concentration regions. This causes the collector-emitter voltage to oscillate in timed relationship with the abrupt decay of the tail current, as indicated in a portion B of FIG. 4. In the IGBT according to the first preferred embodiment, however, there is no abrupt decay of the tail current in the collector current at turn-off because of the substantially uniform impurity concentration of the $p^+$ semiconductor layer 12 in the collector layer 9, as indicated in the portion A. This suppresses the oscillation of the collector-emitter voltage as indicated in the portion B.

Supposing that the $n^+$ doped regions 11 are connected to the n type semiconductor layer 80, the IGBT according to the first preferred embodiment includes a parasitic diode comprised of, for example, the p doped region 2, the n type semiconductor layer 80 and the $n^+$ doped regions 11 as in the second background art IGBT. In the IGBT according to the first preferred embodiment, however, the $n^+$ doped regions 11 are selectively formed in the main surface 103 of the $p^+$ semiconductor layer 12 without being connected to the n type semiconductor layer 80. This prevents the formation of the parasitic diode resulting from the connection between the $n^+$ doped regions 11 and the n type semiconductor layer 80. Therefore, the IGBT according to the first preferred embodiment can perform a stable operation when used in an inverter and the like.

Further, in the IGBT according to the first preferred embodiment, the $n^+$ doped regions 11 of the collector layer 9 are formed in corresponding relation to and only under the channel regions CH1a to CH1d, respectively, of the structure 200. This reliably alleviates electron current crowding in the IGBT.

Figure 5:
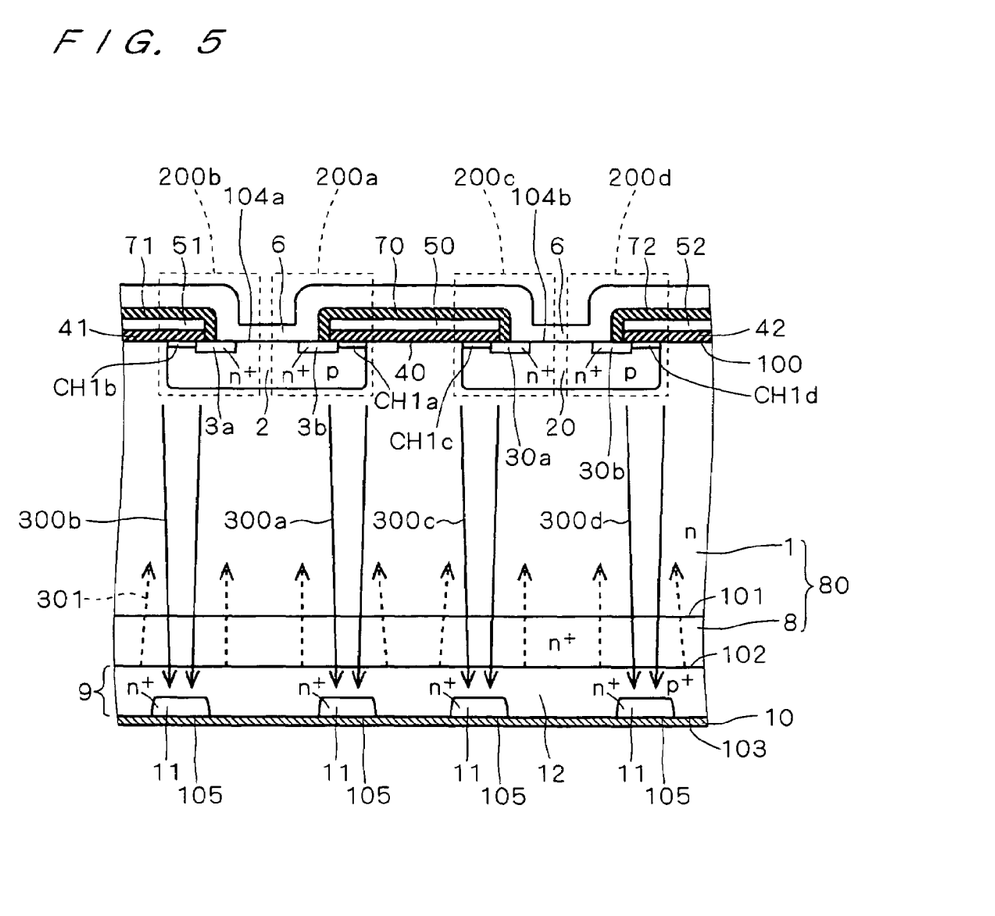
FIG. 5 shows electron currents flowing in the IGBT according to the first preferred embodiment of the present invention.

FIG. 5 shows electron currents flowing in the IGBT according to the first preferred embodiment of the present invention. Electron currents 300a, 300b, 300c and 300d are those flowing under the channel regions CH1a, CH1b, CH1c and CH1d, respectively.

In general, most of the electron currents from the emitter electrode side in an IGBT flow from under the channel regions toward the collector electrode. Further, as stated with respect to the second background art IGBT, when n type doped regions are formed in the collector layer, most of the electron currents from the emitter electrode 6 side flow, in general, toward the n type doped regions.

In the IGBT according to the first preferred embodiment, the $n^+$ doped regions 11 easily conducting the electron currents are formed in corresponding relation to and only under the respective channel regions CH1a to CH1d of the structure 200. Thus, most of the electron currents 300a flow toward one of the $n^+$ doped regions 11 which lies under the channel region CH1a. Similarly, the electron currents 300b flow toward one of the $n^+$ doped regions 11 which lies under the channel region CH1b; the electron currents 300c flow toward one of the $n^+$ doped regions 11 which lies under the channel region CH1c; and the electron currents 300d flow toward one of the $n^+$ doped regions 11 which lies under the channel region CH1d. This reliably alleviates the electron current crowding in the IGBT which has occurred depending on the position and number of regions easily conducting the electron currents in the collector layer. Consequently, the degradation of the IGBT characteristics resulting from the current crowding is reliably reduced.

Second Preferred Embodiment

Figure 6:
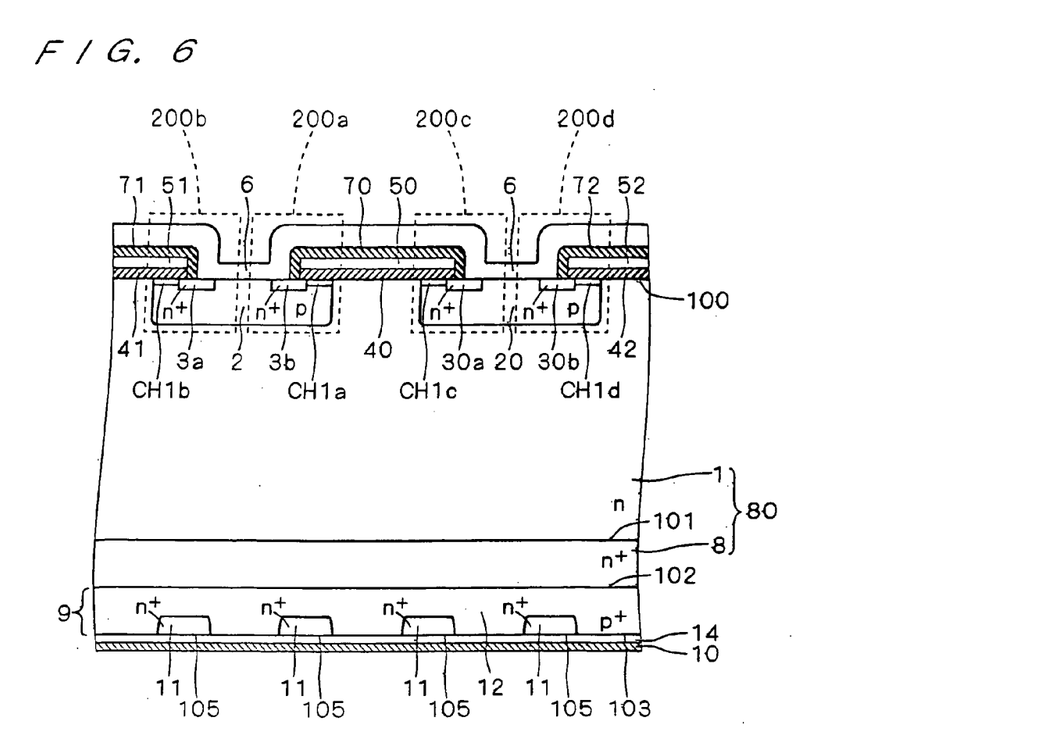
FIG. 6 is a schematic sectional view showing a structure of the IGBT according to a second preferred embodiment of the present invention.

FIG. 6 is a schematic sectional view showing a structure of the IGBT according to a second preferred embodiment of the present invention. The IGBT according to the second preferred embodiment further comprises a polysilicon layer 14 in addition to the components of the IGBT of the first preferred embodiment, the collector electrode 10 being formed over the collector layer 9 with the polysilicon layer 14 therebetween.

As shown in FIG. 6, the polysilicon layer 14 in the IGBT according to the second preferred embodiment is formed on the main surface 103 of the $p^+$ semiconductor layer 12 to cover the surface 105 of each of the $n^+$ doped regions 11. That is, the polysilicon layer 14 is in contact with the surface 105 of each of the $n^+$ doped regions 11 and the main surface 103 of the $p^+$ semiconductor layer 12. The collector electrode 10 is formed on a main surface of the polysilicon layer 14 opposite from the $p^+$ semiconductor layer 12. That is, the collector electrode 10 is formed over the main surface 103 of the $p^+$ semiconductor layer 12 to cover the surface 105 of each of the $n^+$ doped regions 11, with the polysilicon layer 14 lying between the collector electrode 10, and the $p^+$ semiconductor layer 12 and $n^+$ doped regions 11.

In general, contaminative impurities, e.g. heavy metals, introduced in the manufacturing process of the IGBT shorten the lifetime of minority carriers in the IGBT. The shortened lifetime increases the on-state voltage and leakage current of the IGBT. In the IGBT according to the second preferred embodiment having the above-mentioned structure in which the polysilicon layer 14 is in contact with the surface 105 of each of the $n^+$ doped regions 11 and the main surface 103 of the $p^+$ semiconductor layer 12, a stress field generated at the contact surface between the polysilicon layer 14 and the collector layer 9 captures heavy metals. That is, a gettering effect is produced at the contact surfaces between the polysilicon layer 14, and the $n^+$ doped regions 11 and p semiconductor layer 12. This alleviates the lifetime shortening caused by the heavy metals, consequently to alleviate the increase in on-state voltage and in leakage current due to the lifetime shortening.

The conductivity types (p and n types) of impurities in the respective doped regions and the respective semiconductor layers may be interchanged with each other in the first and second preferred embodiment.

While the invention has been described in detail, the foregoing description is in all aspects illustrative and not restrictive. It is understood that numerous other modifications and variations can be devised without departing from the scope of the invention.

What is claimed is:

1. An insulated gate bipolar transistor comprising:
   a first semiconductor layer of a first conductivity type having a first main surface and a second main surface opposite from said first main surface;
   a second semiconductor layer of a second conductivity type formed on an entire face of said first main surface of said first semiconductor layer;
   a plurality of first doped regions of said first conductivity type selectively formed in a main surface of said second semiconductor layer opposite from said first semiconductor layer without being connected to said first semiconductor layer;
   a collector electrode formed on said main surface of said second semiconductor layer to cover an entire surface of each of said first doped regions; and
   a plurality of structures each including
      a second doped region of said second conductivity type selectively formed in said second main surface of said first semiconductor layer without being connected to said second semiconductor layer,
      a third doped region of said first conductivity type selectively formed in a surface of said second doped region without being connected to said first semiconductor layer,
      a channel region defined in a portion of said surface of said second doped region which lies between said third doped region and said first semiconductor layer,
      an insulation film formed on said channel region,
      a gate electrode formed on said insulation film, and
      an emitter electrode connected to said second and third doped regions,
   wherein said plurality of first doped regions are formed in corresponding relation to and only under said channel regions of said structures, respectively.

2. The insulated gate bipolar transistor according to claim 1, further comprising
   a polysilicon layer in contact with said surface of each of said first doped regions and said main surface of said second semiconductor layer,
   wherein said collector electrode is formed over said main surface of said second semiconductor layer to cover said surface of each of said first doped regions, with said polysilicon layer lying between said collector electrode, and said first doped regions and said second semiconductor layer.

3. The insulated gate bipolar transistor according to claim 1,
   wherein said first semiconductor layer comprises a buffer layer having said first main surface, and a third semiconductor layer having said second main surface, and
   wherein said buffer layer is formed on a main surface of said third semiconductor layer opposite from said second main surface, and has an impurity concentration higher than that of said third semiconductor layer.

4. The insulated gate bipolar transistor according to claim 2,
   wherein said first semiconductor layer comprises a buffer layer having said first main surface, and a third semiconductor layer having said second main surface, and
   wherein said buffer layer is formed on a main surface of said third semiconductor layer opposite from said second main surface, and has an impurity concentration higher than that of said third semiconductor layer.

5. The insulated gate bipolar transistor according to claim 1,
   wherein said second semiconductor layer has a substantially uniform impurity concentration.

6. The insulated gate bipolar transistor according to claim 2,
   wherein said second semiconductor layer has a substantially uniform impurity concentration.

7. The insulated gate bipolar transistor according to claim 3,
   wherein said second semiconductor layer has a substantially uniform impurity concentration.

8. The insulated gate bipolar transistor according to claim 4,
   wherein said second semiconductor layer has a substantially uniform impurity concentration.

* * * * *